(12) United States Patent
Nagahara et al.

(10) Patent No.: US 10,749,102 B2
(45) Date of Patent: Aug. 18, 2020

(54) PIEZOELECTRIC VIBRATION COMPONENT AND APPLICATION METHOD

(71) Applicant: Murata Manufacturing Co., Ltd., Nagaokakyo (JP)

(72) Inventors: Koji Nagahara, Nagaokakyo (JP); Muneyuki Daidai, Nagaokakyo (JP); Masahiro Saito, Nagaokakyo (JP); Atsushi Sugimasa, Nagaokakyo (JP); Hiroki Kitayama, Nagaokakyo (JP); Shigehisa Yago, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 582 days.

(21) Appl. No.: 15/680,457

(22) Filed: Aug. 18, 2017

(65) Prior Publication Data

US 2017/0345995 A1    Nov. 30, 2017

Related U.S. Application Data

(63) Continuation of application No. PCT/JP2015/078631, filed on Oct. 8, 2015.

(30) Foreign Application Priority Data

Feb. 24, 2015 (JP) ................. 2015-034302

(51) Int. Cl.
*H01L 41/09* (2006.01)
*B32B 7/12* (2006.01)
(Continued)

(52) U.S. Cl.
CPC ............ *H01L 41/313* (2013.01); *H01L 24/29* (2013.01); *H01L 41/0475* (2013.01);
(Continued)

(58) Field of Classification Search
CPC ..... H01L 41/313; H01L 24/29; H01L 41/053; H01L 41/0815; H01L 2224/29191;
(Continued)

(56) References Cited

U.S. PATENT DOCUMENTS 5,891,367 A     4/1999  Basheer et al.
6,991,751 B2 *  1/2006  Fukushima ................ C09J 9/02
                                                    252/512

(Continued)

FOREIGN PATENT DOCUMENTS

DE    H11-343397 A    12/1999
JP    2005167418 A     6/2005
(Continued)

OTHER PUBLICATIONS

International Search Report issued in International Application No. PCT/JP2015/078631, dated Nov. 24, 2015.
(Continued)

*Primary Examiner* — Thomas M Dougherty
(74) *Attorney, Agent, or Firm* — Arent Fox LLP (57) ABSTRACT

A piezoelectric vibration component that includes a piezoelectric vibrator, a substrate, and a conductive adhesive that bonds the piezoelectric vibrator to the substrate. The conductive adhesive contains a silicone-based base resin, a cross-linker, a conductive filler, and an insulating filler. The silicone-based base resin has a weight-average molecular weight of 20,000 to 102,000. The cross-linker has a number-average molecular weight of 1,950 to 4,620. The conductive filler and the insulating filler have a particle size of 10 μm or less.

20 Claims, 4 Drawing Sheets

(51) Int. Cl.
| | |
|---|---|
| *H01B 1/22* | (2006.01) |
| *H01L 41/313* | (2013.01) |
| *H03H 9/10* | (2006.01) |
| *H03H 3/02* | (2006.01) |
| *H03H 9/05* | (2006.01) |
| *H01L 41/08* | (2006.01) |
| *H01L 41/047* | (2006.01) |
| *H01L 41/053* | (2006.01) |
| *H01L 23/00* | (2006.01) |

(52) U.S. Cl.
CPC ........ *H01L 41/0478* (2013.01); *H01L 41/053* (2013.01); *H01L 41/0815* (2013.01); *H03H 3/02* (2013.01); *H03H 9/0509* (2013.01); *H03H 9/10* (2013.01); *H03H 9/1021* (2013.01); *H01L 2224/2939* (2013.01); *H01L 2224/29191* (2013.01); *H01L 2224/29339* (2013.01); *H01L 2224/29344* (2013.01); *H01L 2224/29355* (2013.01); *H01L 2924/0715* (2013.01)

(58) Field of Classification Search
CPC . H01L 2224/29339; H01L 2224/29344; H01L 2224/29355; H01L 2224/2939; H01L 2924/0715; H03H 3/02; H03H 9/0509; H03H 9/10; H03H 9/1021
USPC .......................................... 310/311–371, 800
See application file for complete search history.

(56) References Cited

U.S. PATENT DOCUMENTS

| | | | |
|---|---|---|---|
| 7,718,256 B1 * | 5/2010 | Frank | .................... C09J 163/00 428/343 |
| 9,424,977 B2 * | 8/2016 | Iwata | ....................... C09K 5/14 |
| 2012/0085579 A1 | 4/2012 | Tatsuzawa et al. | |

FOREIGN PATENT DOCUMENTS

| | | |
|---|---|---|
| JP | 2005-295041 A | 10/2005 |
| JP | 2011-179004 A | 9/2011 |
| JP | 2011-179006 A | 9/2011 |
| JP | 2011-219762 A | 11/2011 |
| JP | 4816827 B2 | 11/2011 |
| JP | 2012-074938 A | 4/2013 |
| JP | 2014112607 A | 6/2014 |

OTHER PUBLICATIONS

Written Opinion of the International Searching Authority issued in International Application No. PCT/JP2015/078631, dated Nov. 24, 2015.

* cited by examiner

PIEZOELECTRIC VIBRATION COMPONENT AND APPLICATION METHOD

CROSS REFERENCE TO RELATED APPLICATIONS

The present application is a continuation of International application No. PCT/JP2015/078631, filed Oct. 8, 2015, which claims priority to Japanese Patent Application No. 2015-034302, filed Feb. 24, 2015, the entire contents of each of which are incorporated herein by reference.

FIELD OF THE INVENTION

The present invention relates to a piezoelectric vibration component, a conductive adhesive for a piezoelectric vibrating component, and a method of applying the conductive adhesive.

BACKGROUND OF THE INVENTION

Conductive adhesives containing conductive fillers dispersed in binder resins are used to mount electronic components on substrates. When pressure bonding is performed with a conductive adhesive interposed between a terminal of an electronic component and a wire arranged on a substrate, the conductive filler particles interposed between the terminal and the wire come into contact with each other and extend to form a conductive path. Examples of this type of conductive adhesive include those in which an insulating filler in addition to a conductive filler are dispersed; and those in which a binder resin therefor contains a cross-linker used to promote the crosslinking between base resin molecules to increase the molecular weight, as described in Patent Documents 1 to 3. Patent Document 1 describes that a base resin preferably has a weight-average molecular weight of 10,000 or more and less than 1,000,000 in order to enhance the mixing properties with another material to be mixed. Patent Document 2 describes that poly(oxypropylenediamine) having a molecular weight of 2,000 or more and less than 5,000 or Jeffamine (registered trademark) having a molecular weight of 2,000 or more and less than 4,000 is used as a cross-linker for an epoxy resin. Patent Document 3 exemplifies an average particle size of 4 μm of a conductive filler and an average particle size of 3 μm of an insulating filler.

Patent Document 1: Japanese Unexamined Patent Application Publication No. 2011-179006
Patent Document 2: Japanese Unexamined Patent Application Publication No. 11-343397
Patent Document 3: Japanese Patent No. 4816827

SUMMARY OF THE INVENTION

With smaller electronic components, jet dispensing methods are employed in order to accurately apply conductive adhesives to bonding sites. The following dispensing methods are known: a common air pulse method in which a predetermined amount of adhesive is discharged from a nozzle tip using air pressure; and a jet dispensing method in which an adhesive is ejected from a nozzle tip by opening and closing an electromagnetic valve to apply the adhesive in a noncontact manner. In the cases of the jet dispensing method, in order to achieve good ejection stability of a conductive adhesive and in order not to increase the application size when the ejected conductive adhesive lands on an adherend surface, the conductive adhesive preferably has appropriate viscosity and anti-dripping properties. A lower molecular weight of a base resin results in a lower viscosity and thus better anti-dripping properties. However, the elastic modulus after curing is increased to decrease the flexibility, thus decreasing the mechanical shock resistance and the conduction reliability. A higher molecular weight of the base resin results in a higher viscosity, thus inhibiting an increase in application size. However, the anti-dripping properties are degraded to hinder the ejection of the conductive adhesive from a jet dispenser. The elastic modulus of the cured conductive adhesive depends on the molecular weight of a cross-linker as well as the molecular weight of the base resin. Thus, the composition of the conductive adhesive is preferably adjusted in consideration of the molecular weight of the cross-linker.

In the case where the conductive adhesive is applied by the jet dispensing method, the particle size of a conductive filler and an insulating filler are preferably adjusted in such a manner that the conductive filler and the insulating filler are easily passed through a nozzle hole. In Patent Documents 1 to 3 described above, the compositions of the conductive adhesives are not adjusted in view of the average molecular weight of the base resin, the molecular weight of the cross-linker, the particle size of the conductive filler and the particle size of the insulating filler in a comprehensive manner in order to achieve a good balance among anti-dripping properties, application size, shock resistance, and conduction reliability required for conductive adhesives.

The present invention has been made in light of the foregoing circumstances. It is an object of the present invention to enable a conductive adhesive before curing to be accurately applied to a bonding site and to enhance the reliability of the conductive adhesive after curing.

A piezoelectric vibration component according to an aspect of the present invention includes a piezoelectric vibrator, a substrate, and a conductive adhesive that bonds the piezoelectric vibrator to the substrate. The conductive adhesive contains a silicone-based base resin, a cross-linker, a conductive filler, and an insulating filler. The silicone-based base resin has a weight-average molecular weight of 20,000 to 102,000, the cross-linker has a number-average molecular weight of 1,950 to 4,620, and the conductive filler and the insulating filler have a particle size of 10 μm or less.

According to the present invention, the conductive adhesive before curing can be accurately applied to a bonding site, and the conductive adhesive after curing can have high reliability.

DETAILED DESCRIPTION OF PREFERRED EMBODIMENTS

Embodiments of the present invention will be described below with reference to FIGS. 1 and 2. Like numerals denote like members, and descriptions are not redundantly repeated.

Figure 1:
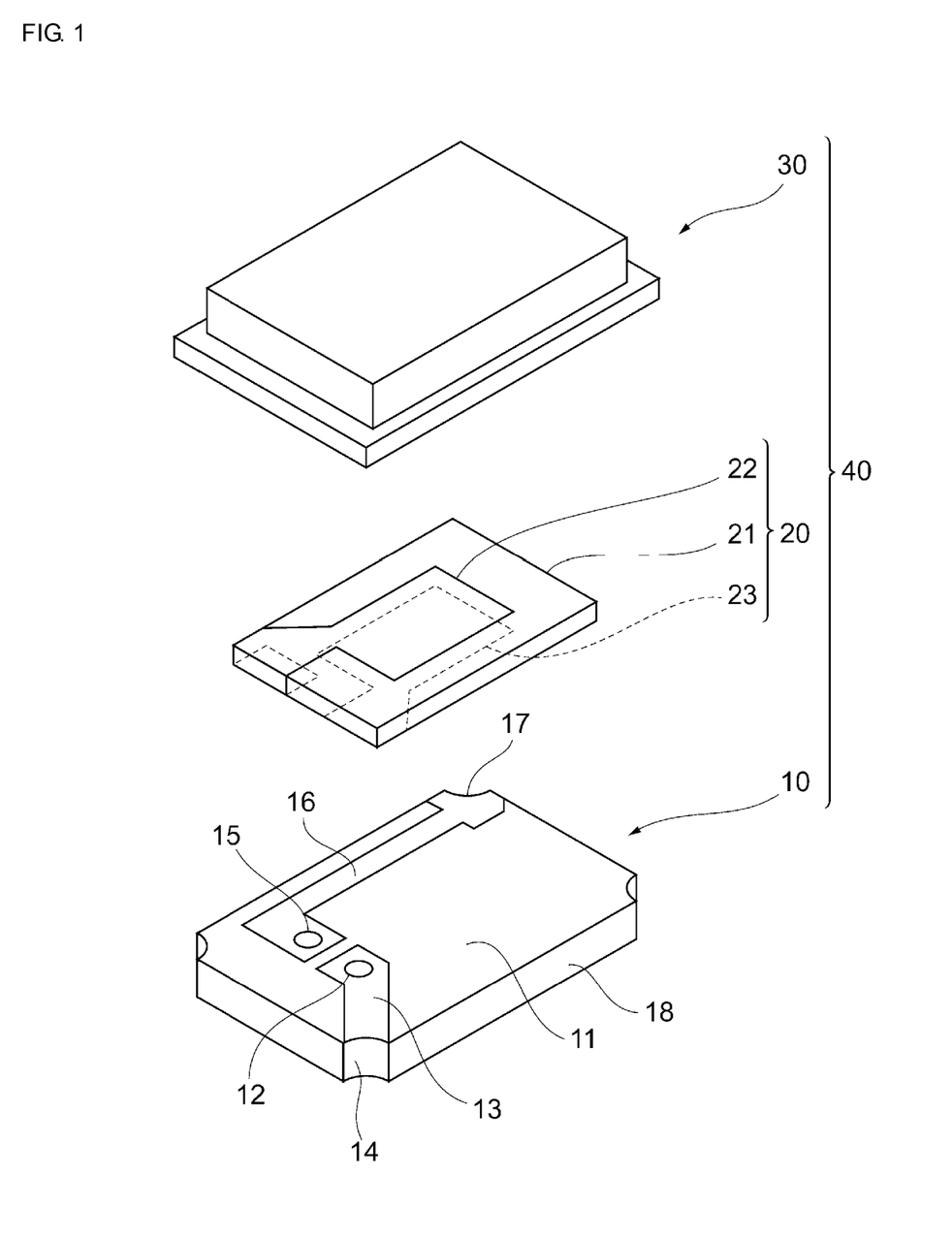
FIG. 1 is an exploded perspective view of a piezoelectric vibration component according to an embodiment of the present invention.

FIG. 1 is an exploded perspective view of a piezoelectric vibration component 40 according to an embodiment of the present invention. As illustrated in the figure, the piezoelectric vibration component 40 mainly includes a piezoelectric vibrator 20, a substrate 10 having a main surface 11 on which a piezoelectric vibrator 20 is mounted, and a lid 30 that seals the piezoelectric vibrator 20 from external air. The piezoelectric vibrator 20 includes a flat-shaped piezoelectric plate 21 having two surfaces that are opposite each other in the thickness direction, an exciting electrode 22 arranged on one surface of the piezoelectric plate 21, and an exciting electrode 23 arranged on the other surface of the piezoelectric plate 21. The application of an alternating voltage to the exciting electrodes 22 and 23 vibrates the piezoelectric plate 21 in a thickness-shear mode. The piezoelectric plate 21 is composed of a piezoelectric material (for example, a quartz plate or a piezoelectric ceramic) that exhibits piezoelectricity. Each of the exciting electrodes 22 and 23 is formed of a conductive thin film composed of, for example, gold, chromium, nickel, aluminum, or titanium.

The substrate 10 has a flat plate shape and has two surfaces that are opposite each other in the thickness direction. One of the two surfaces on which the piezoelectric vibrator 20 is mounted is referred to as a main surface 11. A wire 13 electrically connected to the exciting electrode 23 with a conductive adhesive 12 interposed therebetween and a wire 16 electrically connected to the exciting electrode 22 with a conductive adhesive 15 interposed therebetween are arranged on the main surface 11.

As a method for applying the conductive adhesives 12 and 15 to the wires 13 and 16, respectively, for example, a dispensing method is employed. In particular, a jet dispensing method is preferred. The jet dispensing method is excellent in mass productivity among dispensing methods.

The substrate 10 is composed of a material having appropriate mechanical strength and electrical insulation (for example, an insulating ceramic such as alumina, a synthetic resin, or a composite material formed of a metal plate having a surface coated with an insulating layer). The substrate 10 has cutout portions 14 and 17 formed by partially cutting corner portions (vertex portions) so as to form cylindrically curved surfaces. The wires 13 and 16 extend from the cutout portions 14 and 17 to the backside of the main surface 11 and can be connected to an external circuit. A lid 30 is a lid member with a bottom, is used to seal the piezoelectric vibrator 20 from air, and is composed of a metal material, an insulating material, or a composite material (for example, a composite material formed of an insulating member having a surface coated with a thin metal film).

Figure 2:
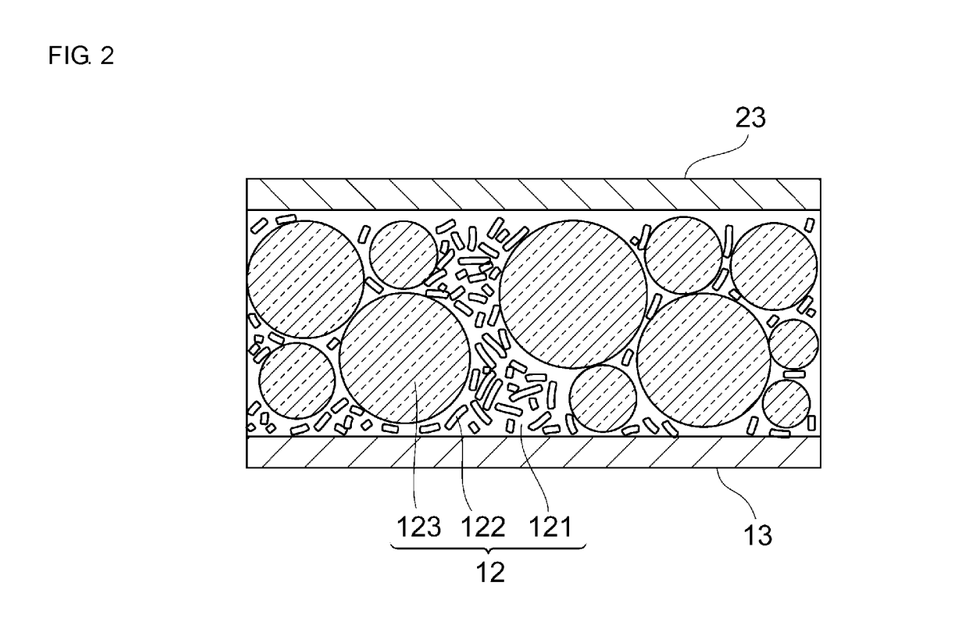
FIG. 2 is a fragmentary sectional view mainly illustrating a connecting portion between a piezoelectric vibrator according to an embodiment of the present invention and a substrate.

FIG. 2 is a fragmentary sectional view mainly illustrating a connecting portion between the exciting electrode 23 of the piezoelectric vibrator 20 and the wire 13 of the substrate 10. The conductive adhesive 12 is an adhesive in which a conductive filler 122 and an insulating filler 123 are dispersed in an adhesive composition 121 serving as a base material. The adhesive composition 121 contains a base resin and a cross-linker (curing agent) that promotes the crosslinking of the base resin to increase the molecular weight. The composition of the conductive adhesive 15 is the same as that of the conductive adhesive 12.

A resin containing a thermosetting component is preferably used as the base resin and is preferably a silicone resin. The silicone resin has a structure containing an inorganic siloxane bond (—Si—O—Si—) serving as a main chain and an organic group serving as a side chain attached thereto and is an addition curable type or a moisture curable type (condensation curable type). The addition curable type is a two-component type including a polysiloxane serving as a base resin and a cross-linker and is cured by heating with a platinum catalyst. The moisture curable type is cured by chemical reaction with moisture at room temperature. A lower weight-average molecular weight of the silicone-based base resin results in a higher elastic modulus (rubber elasticity) of the cured conductive adhesive 12. This tends to decrease the mechanical shock resistance and the conduction reliability. A lower weight-average molecular weight of the silicone-based base resin results in a higher low-molecular-weight-siloxane content. This can cause a low-molecular-weight siloxane to bleed from the cured conductive adhesive 12 to diffuse and thus can have an adverse effect such as contact failure. Furthermore, when it is applied by the jet dispensing method, the application size of the conductive adhesive 12 is unnecessarily and disadvantageously increased. Thus, the substantial lower limit of the weight-average molecular weight of the silicone-based base resin is about 20,000 to about 30,000. A higher weight-average molecular weight of the silicone-based base resin results in the degradation of the anti-dripping properties when the conductive adhesive 12 is applied by the jet dispensing method. Specifically, when the silicone-based base resin has a weight-average molecular weight of more than 80,000, the anti-dripping properties start to degrade. This requires a longer distance between a nozzle and an adherend surface or prolongs the time required for the completion of ejection. Thus, the substantial upper limit of the weight-average molecular weight of the silicone-based base resin that can be stably applied is about 100,000. To adjust the application size of the conductive adhesive applied by the jet dispensing method to 155 μm or less in light of these circumstances, the silicone-based base resin preferably has a weight-average molecular weight of 20,000 to 102,000, more preferably 30,000 to 80,000, particularly preferably 43,000 to 70,000.

The miniaturization of products requires smaller application sizes of conductive adhesives applied by jet dispensing methods. As illustrated in FIG. 1, in the case where the piezoelectric vibrator 20 is held by two points on a short side, the piezoelectric vibrator can be accurately and stably held on the substrate at a width dimension (short-side dimension) of the piezoelectric vibrator 20 of 600 μm to 650 μm and an application size of 130 μm to 155 μm. In this case, the product may have a long side of 1.2 mm and a short side of 1.0 mm.

A higher number-average molecular weight of the cross-linker results in a smaller crosslink density of a cured material to decrease the cohesive force and the adhesive strength; thus, a failure rate in conduction reliability tends to increase. A lower number-average molecular weight of the cross-linker results in a larger crosslink density of a cured material to decrease the flexibility, failing to absorb shock;

thus, a failure rate in a drop resistance test tends to increase. In light of these circumstances, the cross-linker preferably has a number-average molecular weight of 1,950 to 4,620.

The conductive filler 122 may be a filler that is electrically conductive and that can establish an electrical connection. Examples of the conductive filler 122 include metal particles containing Au, Ag, Ni, Cu, solder, and so forth; and carbon particles. The conductive filler 122 may be formed of particles each serving as a core, each of the particles being coated with one or two or more layers, the outermost layer being electrically conductive. In this case, from the viewpoint of achieving better pot life, preferably, the outermost layer is mainly a noble metal such as Au, Ag, or a platinum group metal rather than a transition metal such as Ni or Cu. More preferably, the outermost layer is one or more of these noble metals. Among these noble metals, Au is most preferred. For example, in order to adjust the particle size of the conductive adhesive 12 applied by the jet dispensing method to 155 μm or less, the conductive filler 122 preferably has a particle size of 10 μm or less. The conductive filler 122 may have any shape such as a spherical shape or scale-like shape and may have a combined shape of multiple shapes.

The insulating filler 123 may be a filler that does not establish electrical continuity between the insulating filler 123 and the conductive filler 122 when in contact with the conductive filler 122. As the insulating filler 123, particles mainly containing an insulating resin are preferred. Examples of the insulating resin include polyethylene resins, polystyrene resins, polyamide resins, polyurethane resins, (meth)acrylic resins, (meth)acrylate copolymers such as styrene-(meth)acrylate copolymers and ethylene-(meth)acrylate copolymers, (meth)acrylic acid copolymers such as ethylene-(meth)acrylic acid copolymers, styrene-divinylbenzene copolymers, styrene-butadiene copolymers, divinylbenzene resins, styrene-isobutylene copolymers, ethylene-propylene copolymers, phenoxy resins, solid epoxy resins, and silicone resins. Among these, silicone resins are preferred in view of better flexibility. The use of a silicone resin as the insulating filler 123 can reduce the elastic modulus of the cured conductive adhesive 12 to enhance the mechanical shock resistance and the conduction reliability. The silicone resins are used alone or in combination of two or more. The insulating filler 123 may be formed of particles composed of an insulating material mainly containing an insulating resin or may be formed of insulating or conductive particles each serving as a core, each of the particles being coated with one or two or more insulating or conductive layers, the outermost layer having insulating properties. For example, in order to adjust the particle size of the conductive adhesive 12 applied by the jet dispensing method to 155 μm or less, the insulating filler 123 preferably has a particle size of 10 μm or less. The insulating filler 123 may have any shape such as a spherical shape or scale-like shape and may have a combined shape of multiple shapes.

As illustrated in FIG. 2, in the case where the conductive filler 122 has a scale-like shape, where the insulating filler 123 has a spherical shape, and where the conductive filler 122 is smaller than the insulating filler 123, gaps between particles of the insulating filler 123 can be larger than that of the case where the insulating filler 123 has a scale-like shape. Since the conductive filler 122 has a scale-like shape and is smaller than the insulating filler 123, particles of the conductive filler 122 are tightly packed, so that the conductive filler 122 is densely packed in the gaps between the particles of the insulating filler 123. This can result in high electrical connection reliability of the conductive adhesive 12. From these points of view, the median size of the conductive filler 122 is preferably smaller than the median size of the insulating filler 123. For example, the median size of the conductive filler 122 may be 2.1 μm, and the median size of the insulating filler 123 may be 4.0 μm.

The application of the conductive adhesive 12 is not limited to the bonding of the piezoelectric vibrator 20 and the substrate 10, and the conductive adhesive 12 can be used for the production of any electronic component. In particular, the conductive adhesive 12 can be suitably used in a step of producing an electronic component by applying the conductive adhesive 12 to an adherend surface using the jet dispensing method.

EXAMPLE 1

Figure 3:
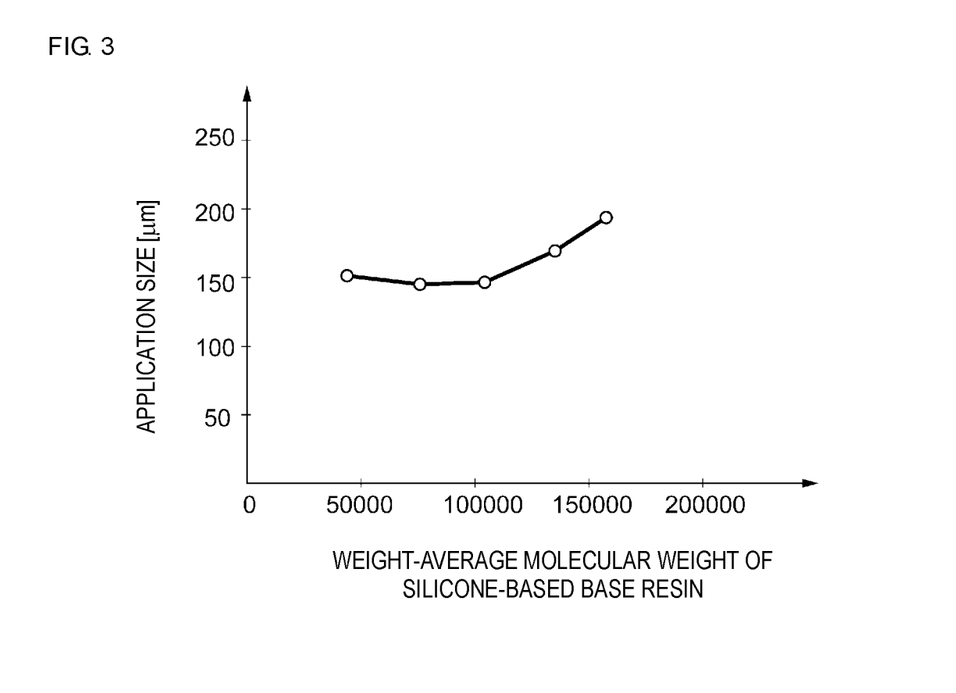
FIG. 3 is a graph depicting the relationship between the weight-average molecular weight of a silicone-based base resin according to an embodiment and the application size.

The weight-average molecular weights of silicone-based base resins were adjusted to 43,000, 72,000, 102,000, 131,000, and 160,000. The application sizes of the conductive adhesives 12 applied by a jet dispensing method were measured. As illustrated in FIG. 3, the application sizes were 152.6 μm, 149 μm, 150 μm, 186.9 μm, and 199 μm for the respective weight-average molecular weights. The experimental results indicate that the silicone-based base resin preferably has a weight-average molecular weight of 102,000 or less in order to adjust the application size of the conductive adhesive 12 applied by the jet dispensing method to 155 μm or less. The weight-average molecular weight of the silicone-based base resin was measured by high-performance liquid chromatography and calculated as a relative molecular weight in terms of polystyrene.

EXAMPLE 2

Figure 4:
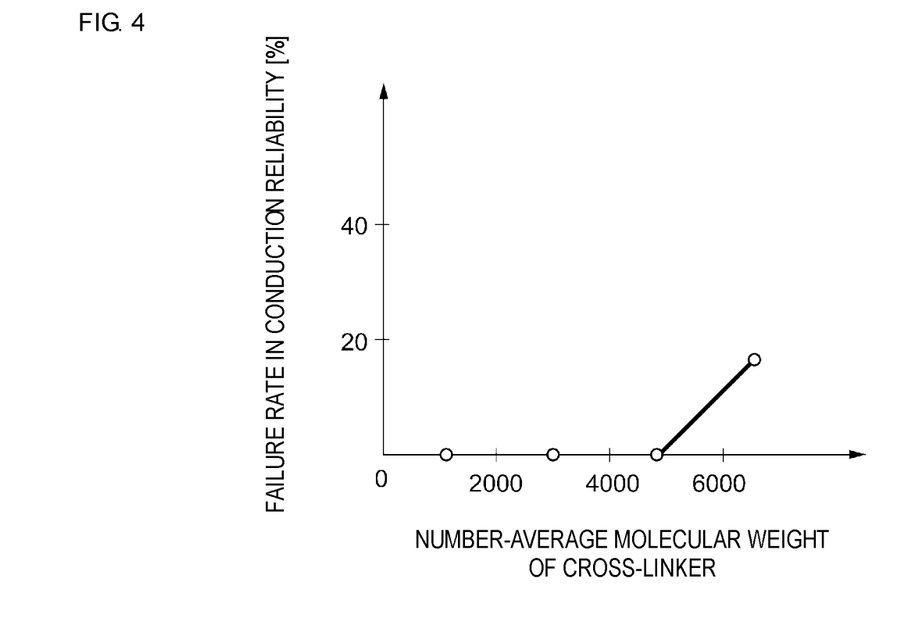
FIG. 4 is a graph depicting the relationship between the number-average molecular weight of a cross-linker according to an embodiment and the failure rate in conduction reliability.

The number-average molecular weights of cross-linkers were adjusted to 1,200, 2,900, 4,620, and 6,100. Failure rates in the conduction reliability of the conductive adhesives 12 were measured. As illustrated in FIG. 4, the failure rates in the conduction reliability were 0%, 0%, 0%, and 17% for the respective number-average molecular weights. The experimental results indicate that the cross-linker preferably has a number-average molecular weight of 4,620 or less in order to enhance the conduction reliability of the conductive adhesive 12. In the measurement of the failure rate in conduction reliability, the conductive adhesive 12 was applied to a groove (with a width of 30 μm and a depth 30 μm) of a ceramic substrate having a surface on which an electrode (underlying electrode of nickel alloy (film thickness: 0.1 82 m) and overlying electrode of gold (film thickness: 0.4 μm)) was arranged, and then the conductive adhesive 12 was cured in air at a temperature environment of 200° C. over a period of 60 minutes. The case where the resistance of the conductive adhesive 12 was more than five times the initial value in the course of the application of a stress was determined as "failure". The resistance was measured by a four-terminal method with a milliohm meter. The number of samples used for the measurement of the failure rate in conduction reliability was six.

EXAMPLE 3

Figure 5:
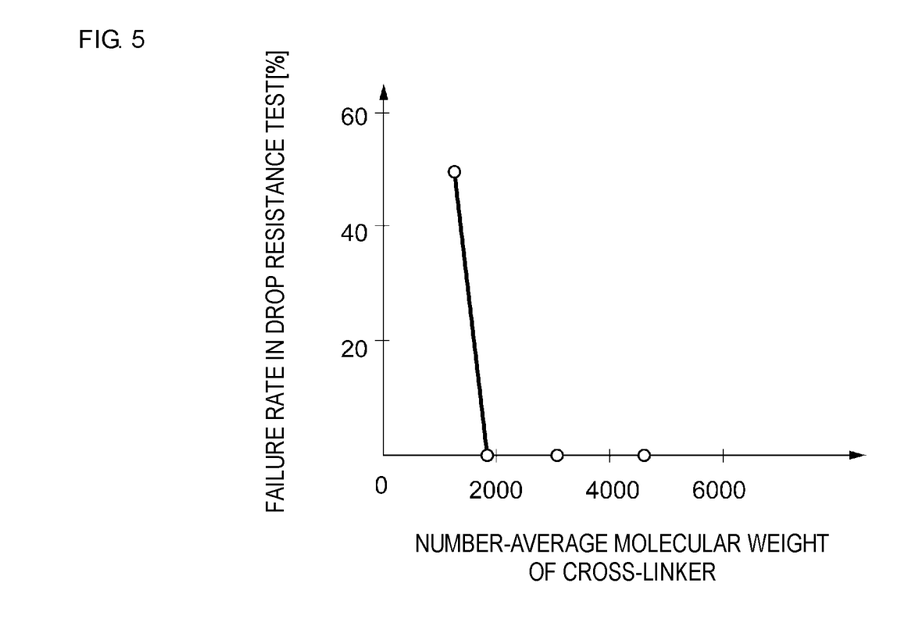
FIG. 5 is a graph depicting the relationship between the number-average molecular weight of a cross-linker according to an embodiment and the failure rate in a drop resistance test.

The number-average molecular weights of cross-linkers were adjusted to 1,200, 1,950, 2,900, and 4,620. Failure rates in the drop resistance test of the conductive adhesives 12 were measured. As illustrated in FIG. 5, the failure rates in the drop resistance test were 50%, 0%, 0%, and 0% for the respective number-average molecular weights. The experimental results indicate that the cross-linker preferably has a number-average molecular weight of 1,950 or more in order to enhance the shock resistance of the conductive adhesive 12. In the measurement of the failure rate in the drop resistance test, the piezoelectric vibrator 20 was mounted on the substrate 10 with the conductive adhesive 12 to produce the piezoelectric vibration component 40, and the piezoelectric vibration component 40 was mounted on a test board. The test board was fixed by a screw to the inside of a test jig simulating a cellular phone case. A step of performing a single drop of the test jig from a height of 1.5 m onto concrete for each surface was repeated a total of six times with a corresponding surface facing down. This operation was defined as one cycle. A sample in which the electrical characteristics between the piezoelectric vibrator 20 and the substrate 10 were not provided within 100 cycles was determined as "failure". The number of samples used for the measurement of the failure rate in the drop resistance test was six.

EXAMPLE 4

Figure 6:
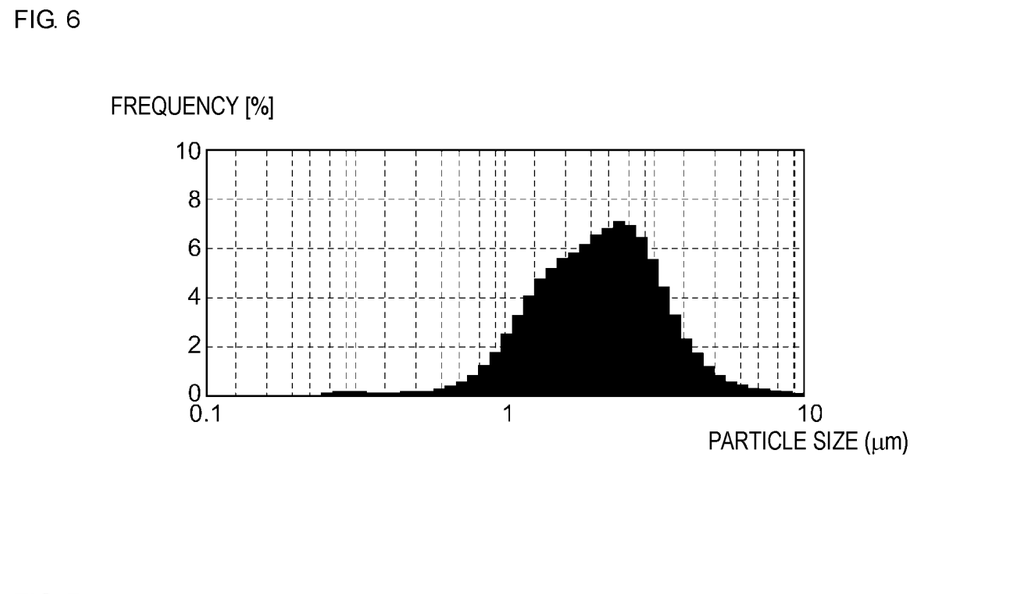
FIG. 6 is a graph depicting the particle size distribution of a conductive filler according to an embodiment.
Figure 7:
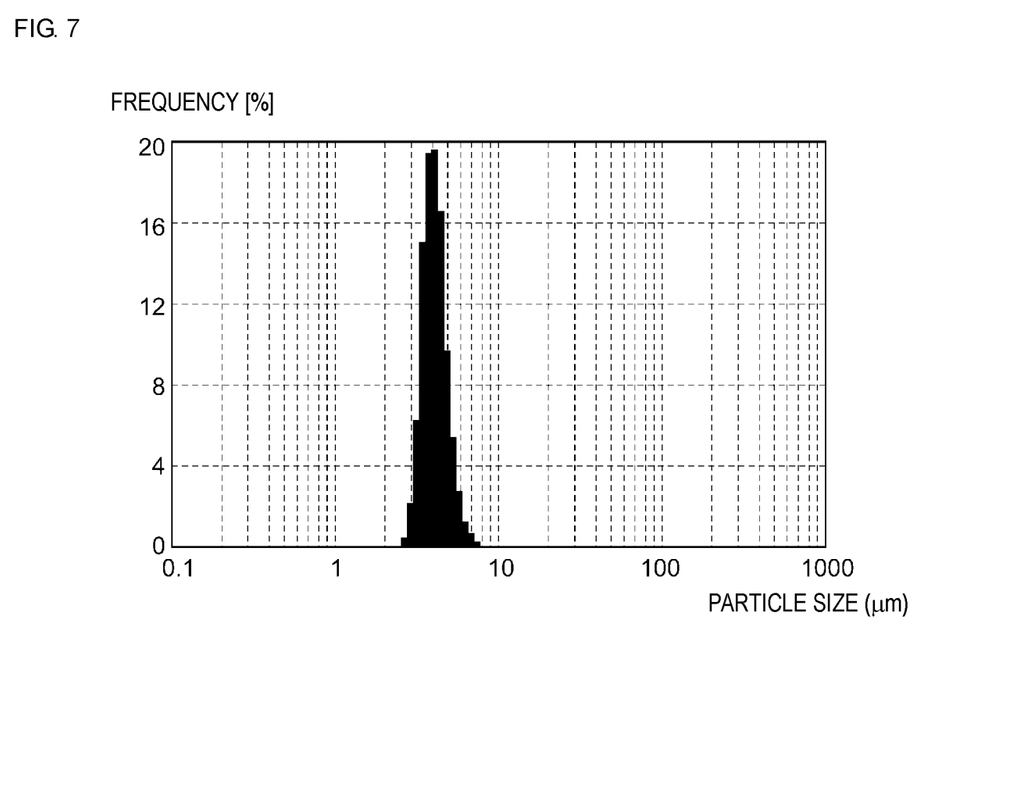
FIG. 7 is a graph depicting the particle size distribution of an insulating filler according to an embodiment.

The piezoelectric vibrator 20 having a resonant frequency of 37.4 MHz was made with the conductive adhesive 12 having an elastic modulus of 293 MPa on an experimental basis. A silver filler having a median size of 2.1 μm and a maximum size of 10 μm, as illustrated in FIG. 6, was used as the conductive filler 122. A silicone resin filler having a median size of 4.0 μm and a maximum size of 10 μm, as illustrated in FIG. 7, was used as the insulating filler 123. A silicone-based base resin having a weight-average molecular weight of 72,000 was used as a silicone-based base resin. The silicone-based base resin was prepared from a silicone-based base resin (75% by weight) having a weight-average molecular weight of 43,000 and a silicone-based base resin (25% by weight) having a weight-average molecular weight of 160,000. A cross-linker having a number-average molecular weight of 3,030 was used. In the case where the conductive adhesive 12 was applied by a jet dispensing method, it was possible to perform 6,000 or more continuous microapplications at an application size of 130 μm or less. The experimental results indicate that the use of the silicone-based base resin having a weight-average molecular weight of 80,000 or less results in good anti-dripping properties of the conductive adhesive 12 and enables the conductive adhesive 12 to be stably ejected by the jet dispensing method. The use of the silicone resin filler as the insulating filler 123 results in a higher flexibility of the conductive adhesive 12 to provide good anti-dripping properties, thereby enabling continuous microapplications to be stably performed. The use of the conductive filler 122 and the insulating filler 123 that have a maximum size of 10 μm enables the conductive adhesive 12 to be stably ejected from a micronozzle of a jet dispenser. The equivalent series resistance of the piezoelectric vibrator 20 was measured and found to be 35.6Ω on average, which was satisfactory value. The failure rate of the drop resistance test of the piezoelectric vibrator 20 was measured and found to be zero until the number of drops was 100. The experimental results indicate that the use of the silicone resin filler as the insulating filler 123 and the use of the cross-linker having a number-average molecular weight of 1,050 or more enable the elastic modulus of the cured conductive adhesive 12 to be reduced to enhance the mechanical shock resistance. The number of samples used for the measurement of the failure rate in the drop resistance test was six.

It is noted that the embodiments have been described above for ease of understanding of the present invention and are not intended to limit the scope of the present invention. Changes and improvements may be made to the present invention within the scope of the invention, and the present invention includes equivalents thereof. In other words, design changes may be suitably made to the embodiments by those skilled in the art, and such embodiments are also within the scope of the present invention as long as they have the features of the present invention. For example, the elements included in the embodiments and the arrangements, materials, conditions, shapes, sizes and the like of the elements are not limited to those described above as examples, and they may be suitably changed. In addition, the elements included in the embodiments can be combined with each other as long as it is technically possible, and such combinations are also within the scope of the present invention as long as the combinations have the features of the present disclosure.

REFERENCE SIGNS LIST 10 substrate
11 main surface
12 conductive adhesive
13 wire
14 cutout portion
15 conductive adhesive
16 wire
17 cutout portion
20 piezoelectric vibrator
21 piezoelectric plate
22 exciting electrode
23 exciting electrode
30 lid
40 piezoelectric vibration component
121 adhesive composition
122 conductive filler
123 insulating filler

The invention claimed is:
1. A piezoelectric vibration component comprising:
a piezoelectric vibrator;
a substrate; and
a conductive adhesive that bonds the piezoelectric vibrator to the substrate,
wherein the conductive adhesive contains a silicone-based base resin, a cross-linker, a conductive filler, and an insulating filler,
the silicone-based base resin has a weight-average molecular weight of 20,000 to 102,000,
the cross-linker has a number-average molecular weight of 1,950 to 4,620, and
the conductive filler and the insulating filler have a particle size of 10 μm or less.
2. The piezoelectric vibration component according to claim 1, wherein the weight-average molecular weight of the silicone-based base resin is 30,000 to 80,000.
3. The piezoelectric vibration component according to claim 1, wherein the weight-average molecular weight of the silicone-based base resin is 43,000 to 72,000.
4. The piezoelectric vibration component according to claim 1, wherein the silicone-based base resin has a structure containing an inorganic siloxane bond serving as a main chain and an organic group serving as a side chain attached to the main chain.
5. The piezoelectric vibration component according to claim 1, wherein a first median size of the conductive filler is smaller than a second median size of the insulating filler.

6. The piezoelectric vibration component according to claim 1, wherein the conductive filler includes metal particles selected from Au, Ag, Ni, and carbon particles.

7. The piezoelectric vibration component according to claim 1, wherein the conductive filler includes metal particles containing silver.

8. The piezoelectric vibration component according to claim 7, wherein the insulating filler is a spherical silicone resin.

9. The piezoelectric vibration component according to claim 1, wherein the insulating filler is a spherical silicone resin.

10. The piezoelectric vibration component according to claim 1, wherein the insulating filler is selected from polyethylene resins, polystyrene resins, polyamide resins, polyurethane resins, (meth)acrylic resins, (meth)acrylate copolymers, (meth)acrylic acid copolymers, styrene-divinylbenzene copolymers, styrene-butadiene copolymers, divinylbenzene resins, styrene-isobutylene copolymers, ethylene-propylene copolymers, phenoxy resins, solid epoxy resins, and silicone resins.

11. A conductive adhesive comprising:
a silicone-based base resin having a weight-average molecular weight of 20,000 to 102,000;
a cross-linker having a number-average molecular weight of 1,950 to 4,620;
a conductive filler; and
an insulating filler,
wherein the conductive filler and the insulating filler have a particle size of 10 μm or less.

12. The conductive adhesive according to claim 11, wherein the weight-average molecular weight of the silicone-based base resin is 30,000 to 80,000.

13. The conductive adhesive according to claim 11, wherein the weight-average molecular weight of the silicone-based base resin is 43,000 to 72,000.

14. The conductive adhesive according to claim 11, wherein the silicone-based base resin has a structure containing an inorganic siloxane bond serving as a main chain and an organic group serving as a side chain attached to the main chain.

15. The conductive adhesive according to claim 11, wherein a first median size of the conductive filler is smaller than a second median size of the insulating filler.

16. The conductive adhesive according to claim 11, wherein the conductive filler includes metal particles selected from Au, Ag, Ni, and carbon particles.

17. The conductive adhesive according to claim 11, wherein the conductive filler includes metal particles containing silver.

18. The conductive adhesive according to claim 17, wherein the insulating filler is a spherical silicone resin.

19. The conductive adhesive according to claim 11, wherein the insulating filler is a spherical silicone resin.

20. The conductive adhesive according to claim 11, wherein the insulating filler is selected from polyethylene resins, polystyrene resins, polyamide resins, polyurethane resins, (meth)acrylic resins, (meth)acrylate copolymers, (meth)acrylic acid copolymers, styrene-divinylbenzene copolymers, styrene-butadiene copolymers, divinylbenzene resins, styrene-isobutylene copolymers, ethylene-propylene copolymers, phenoxy resins, solid epoxy resins, and silicone resins.

* * * * *